United States Patent
Volant et al.

(10) Patent No.: US 6,375,859 B1
(45) Date of Patent: Apr. 23, 2002

(54) PROCESS FOR RESIST CLEAN UP OF METAL STRUCTURES ON POLYIMIDE

(75) Inventors: Richard P. Volant, New Fairfield, CT (US); Joseph T. Kocis, Pleasant Valley, NY (US); Waldemar W. Kocon, Wappingers Falls, NY (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/244,935

(22) Filed: Feb. 4, 1999

(51) Int. Cl.[7] .............................. B44C 1/22; B08B 7/00
(52) U.S. Cl. ............................ 216/57; 216/67; 216/83; 134/1.2
(58) Field of Search ................. 216/49, 57, 67, 216/75, 83; 430/313, 318, 329; 438/623, 704, 725, 734, 720, 745; 134/1.3, 1.1, 1.2

(56) References Cited

U.S. PATENT DOCUMENTS

| | | | |
|---|---|---|---|
| 4,368,220 A | | 1/1983 | Eldridge et al. ......... 427/255.4 |
| 4,639,290 A | | 1/1987 | Leyden et al. .............. 156/644 |
| 4,789,427 A | * | 12/1988 | Fujimura et al. ........... 156/643 |
| 5,007,981 A | * | 4/1991 | Kawasaki et al. .......... 156/643 |
| 5,279,771 A | | 1/1994 | Lee ............................. 252/548 |
| 5,520,299 A | | 5/1996 | Belcher et al. ............... 216/66 |
| 5,533,635 A | * | 7/1996 | Man ............................. 216/67 |
| 5,690,747 A | | 11/1997 | Doscher ........................ 134/1 |
| 5,702,869 A | * | 12/1997 | Chien et al. ................. 430/313 |
| 5,767,015 A | * | 6/1998 | Tabara ......................... 438/654 |
| 5,795,702 A | | 8/1998 | Tanabe et al. ............... 430/331 |
| 5,904,570 A | * | 5/1999 | Chen et al. .................... 216/67 |
| 6,027,995 A | * | 2/2000 | Chiang et al. .............. 438/623 |
| 6,044,850 A | * | 4/2000 | Ozawa et al. ................. 216/57 |
| 6,051,491 A | * | 4/2000 | Ito ............................... 438/619 |
| 6,078,067 A | * | 6/2000 | Oikawa ....................... 257/192 |
| 6,097,095 A | * | 8/2000 | Chung ......................... 257/774 |
| 6,107,202 A | * | 8/2000 | Chiu et al. .................. 438/690 |

FOREIGN PATENT DOCUMENTS

JP        09-17796 A    *   1/1997

OTHER PUBLICATIONS

Grill, Cold Plasma in Materials Fabrication, IEEE Press, pp. 163–166. 1994.*
IBM Tech. Discl. Bull. "Hybrid Ash NMP Photoresist Strip Process for Use With Perfluorinated Resist" vol. 27, No. 4A, p. 2047, Sep. 1984.*

* cited by examiner

*Primary Examiner*—Alexander Markoff
(74) *Attorney, Agent, or Firm*—Ratner & Prestia; H. Daniel Schnurmann

(57) ABSTRACT

A process for removing a resist material containing a chlorine residue from an organic substrate. The process first removes the chlorine residue from the resist material by exposing the resist material to an abbreviated plasma which also removes a portion of the resist material. The remainder of the resist material is removed by exposing the resist material to a solvent which does not affect the organic substrate.

25 Claims, 5 Drawing Sheets

PROCESS FOR RESIST CLEAN UP OF METAL STRUCTURES ON POLYIMIDE

FIELD OF THE INVENTION

The present invention generally relates to fabrication of metallic structures on a substrate and, more particularly, to a process for removing a resist film containing chlorine residue without affecting an underlying organic structure.

BACKGROUND OF THE INVENTION

The fabrication of passive radio frequency (RF) devices as an on-chip solution for the growing communication industry presents many problems. Problems arise especially when fabricating structures on silicon substrates so as to be compatible with mainstream semiconductor manufacturing techniques. One major problem is RF coupling to the silicon substrate. The silicon substrates used in modern semiconductor production must be isolated from the passive structures as much as possible in order to achieve minimal loss in transmission lines and satisfactory inductor quality factors.

One conventional method of isolation is to place the structures as far from the substrate as possible. This configuration can be achieved by building the structures as the last metal layer and placing them on top of a relatively thick layer of organic polymer, such as polyimide, having a low dielectric constant. The problem with defining metal structures, having small dimensions, on top of an organic material becomes evident when consideration is given to the need to effectively remove the photoresist, which is also an organic material, that defines the structures, without damaging the underlying organic dielectric.

Typically, passive RF transmission lines and inductors are located off chip due to the high losses and poor quality factors of these structures when built on silicon substrates. Placement of these structures over a thick dielectric layer helps to minimize the substrate coupling effects. Although metal lines have been built on top of these organic layers in the past, these have been much larger structures and were able to be fabricated using simple wet etch techniques. As the dimensional requirements have decreased and tolerances have become more critical, the industry is faced with structures small enough that an anisotropic dry or plasma etch must be used.

It has long been known in the art that a chlorine-based plasma etch is very effective for metal reactive ion etching (RIE). This etch has a drawback, however, in that residual chlorine in the photoresist, as well as any underlying organics, will rapidly corrode the metal layer once exposed to atmosphere. This problem is typically resolved by totally stripping the photoresist in a plasma containing oxygen before removing the semiconductor wafers from the vacuum chamber. Although this technique may be effective for removing the photoresist and preventing corrosion, it only works well when the plasma does not affect the underlying layer. When the underlying layer is also an organic material, such as polyimide, it is severely eroded in an isotropic manor. Such erosion is illustrated in FIGS. 2A, 2B, and 2C.

In FIG. 2A, a semiconductor device 200 is shown. An isolation layer of organic material 204 is applied over a substrate 202. A metal layer 206 is then formed over organic layer 204 and a photoresist 208 is patterned over the metal layer 206. In FIG. 2B, the metal layer 206 is etched using a chlorine-based plasma etch. In FIG. 2C, an in situ plasma strip is used to totally remove the photoresist 208 in a single step. This process creates an isotropic erosion 210 under metal layer 206, and may totally undercut metal lines as large as 5 microns. As the dimensions of the metal features get smaller, this undercut problem becomes increasingly critical.

The deficiencies of the conventional photoresist strip methods show that a need still exists for an improved process for removing a resist film containing chlorine residue without affecting an underlying organic structure. The object of the present invention is to overcome the shortcomings of the conventional processes and to meet this need.

SUMMARY OF THE INVENTION

Following conventional wisdom, it is believed that the total or near-total strip using a plasma is needed to prevent corrosion. The inventors of the present invention have determined that a much-abbreviated exposure to the plasma may be used to ensure removal of the residual chlorine. This determination leads to a unique combination of plasma strip and solvent etching to remove the photoresist while leaving any underlying organic materials intact.

More specifically, the present invention relates to a process for removing a resist material containing a chlorine residue from an organic substrate. The process comprises the steps of removing the chlorine from the resist material by exposing the resist material to an abbreviated plasma, and removing the remaining resist material by exposing the resist material to a wet solvent.

The present invention further relates to a process for removing a resist material in which about 25% of the resist is striped using a plasma containing oxygen. The present invention still further relates to a process for removing a resist material in which the remaining resist is removed using a wet etch process containing an N-Methyl-2-Pyrrolidone (NMP) etchant, followed by an AZ etchant, which is followed by a further NMP etch. The present invention finally relates to a method of forming a passive RF device over a substrate.

The method comprises the steps of forming an organic layer over the substrate, forming a metal layer over the organic layer, disposing a photoresist over the metal layer, exposing at least a portion of the photoresist to an illumination source to define a pattern of the RF device on the metal layer, removing the unexposed portion of the photoresist from the metal layer to expose at least a portion of the metal layer, etching the portion of the metal layer using an etchant containing chlorine, the etching exposing at least a portion of the organic layer, removing chlorine from the resist material and the exposed portion of the organic layer by an abbreviated exposure to a plasma, and removing the remaining portion of the photoresist material.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2D shows the device of FIG. 2C after a fourth step in the conventional process;

DETAILED DESCRIPTION OF THE INVENTION

Figure 4:
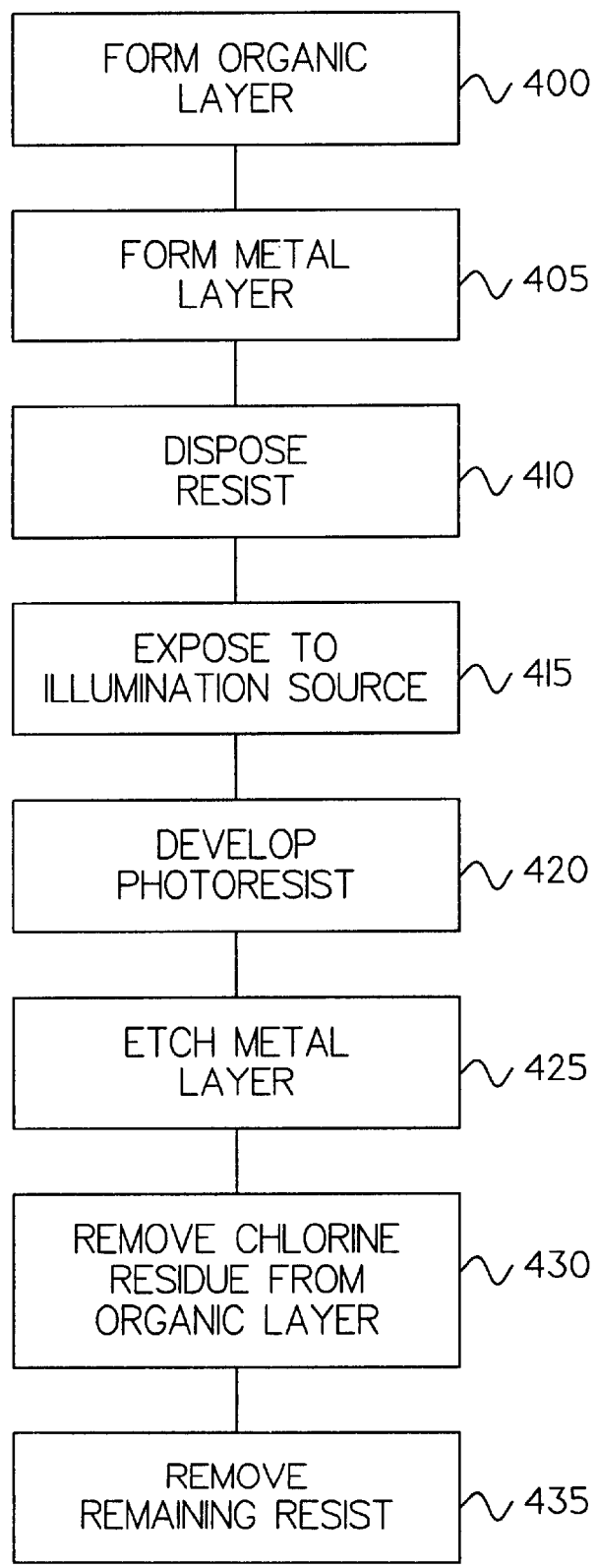
FIG. 4 is a flow chart illustrating the steps of an exemplary process of the present invention.

FIGS. 1A, 1B, 1C, and 1D illustrate an exemplary embodiment of the present invention for manufacturing a semiconductor device 100. Referring to FIG. 4, a flow chart of a process according to an exemplary embodiment of the present invention is shown. In FIG. 4, at Step 400 an organic layer 104 (shown in FIG. 1A) is formed to a desired thickness over a substrate 102. As understood by one of ordinary skill in the art, the substrate 102 may have devices (not shown) formed within the substrate before application of the process according to the exemplary embodiment. These devices may be passive devices or active devices, such as transistors or diodes, for example. The organic layer 104 is then cured and vias (not shown) are formed.

At Step 405, a metal layer 106 (shown in FIG. 1A) is disposed over organic layer 104. At Step 410, a photoresist 108 (shown in FIG. 1A) is disposed over the metal layer 106. In the exemplary embodiment, an organic photoresist, such as AZ resist manufactured by Clariant Corp. of Somerville, N.J., is used, although any diazonaphthoquinone-based resist may be used.

At Step 415, device 100 is exposed to an illumination source (not shown) to form a desired pattern that defines the metal structures 106A (shown in FIG. 1B) in metal layer 106. At Step 420, the photoresist 108 is developed according to conventional methods. It should be noted that, although AZ resist is a positive resist, the exemplary embodiment will work equally well using a negative resist if desired.

At Step 425, the metal layer 106 is etched to define small geometry metal structures 106A on the organic layer 104 using current semiconductor manufacturing tools and processes, such as a dry RIE. The etching step may remove a portion of organic layer 104 (shown as removed portion 110 in FIG. 1B).

At Step 430, a very short strip is performed using a plasma containing oxygen. The duration of the plasma strip is controlled so as to be sufficient to remove residual chlorine from the surface of all organic materials, thus protecting the metal from corrosion. The inventors have found that removal of about 25% to 50% of the photoresist 108 (shown as photoresist 108A in FIG. 1C) removes a minimal amount of the organic layer 104 (shown as removed amount 112 in FIG. 1C). By minimizing the plasma portion of the strip, erosion of the underlying organic layer 104 may be avoided, thus preventing the undercutting of the metal structures. An undercut of the metal structures might cause total failure of the features. At Step 435, an aggressive solvent combination is used to completely strip the remaining photoresist 108A without damaging the underlying organic materials.

In the exemplary embodiment, a 25% strip is used during which the plasma strip time is reduced to about 25% of the conventional strip time, although a strip of about 25% to 50% has been found to achieve the desired results. The inventors have found that this time may vary between about 20 seconds to 100 seconds, depending on the type of resist system used and the strip level desired. In the exemplary embodiment, for an AZ organic resist and an AZ resist remover, the time to remove about 25% of the AZ resist using the AZ resist remover is about 50 seconds.

Figure 1A:
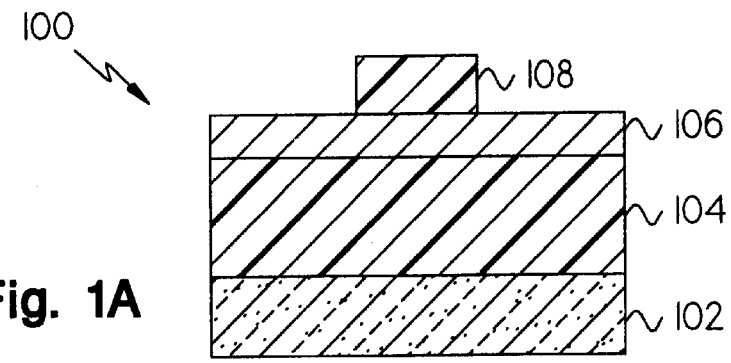
FIG. 1A illustrates a side view of a semiconductor device after a first step in an exemplary embodiment of the process of the present invention.
Figure 1B:
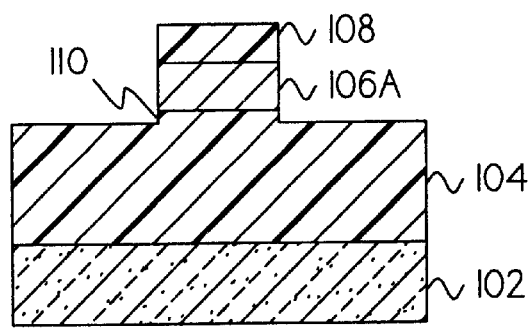
FIG. 1B shows the device of FIG. 1A after a second step in the process of the present invention.
Figure 1C:
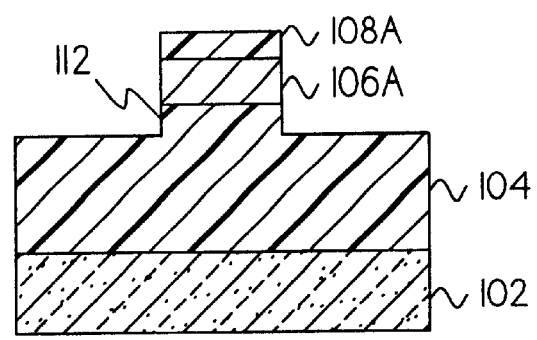
FIG. 1C shows the device of FIG. 1B after a third step in the process of the present invention.
Figure 1D:
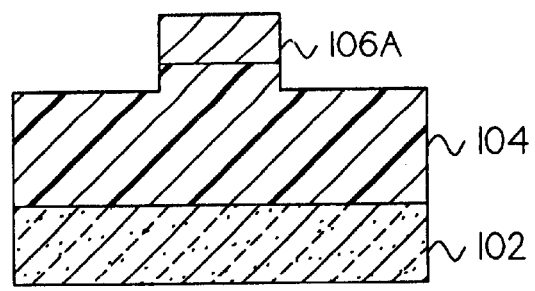
FIG. 1D shows the device of FIG. 1C after a fourth step in the process of the present invention.
Figure 2A:
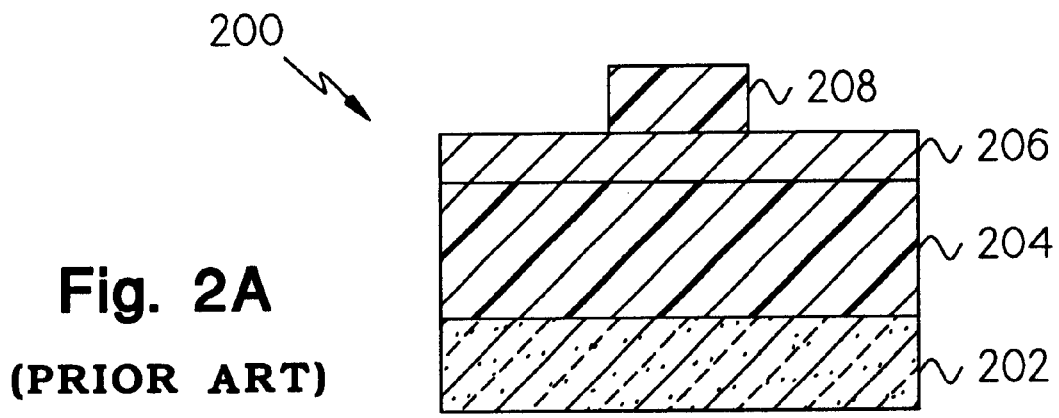
FIG. 2A illustrates a side view of a semiconductor device after a first step in a conventional process.
Figure 2B:
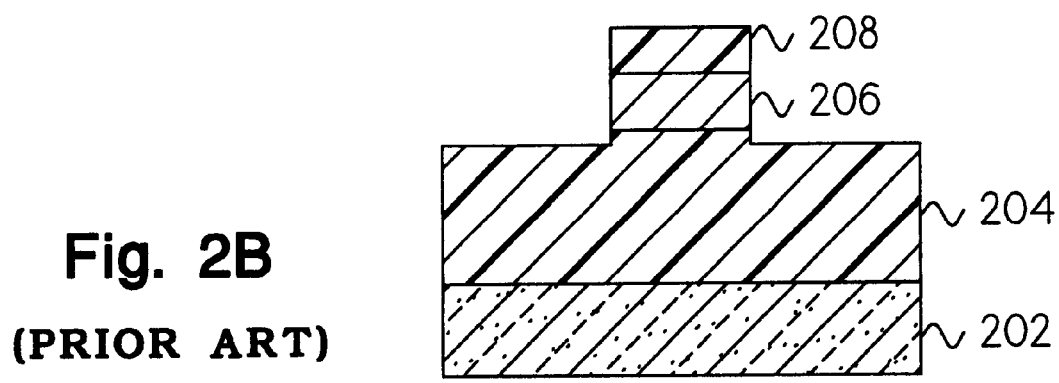
FIG. 2B shows the device of FIG. 2A after a second step in the conventional process.
Figure 2C:
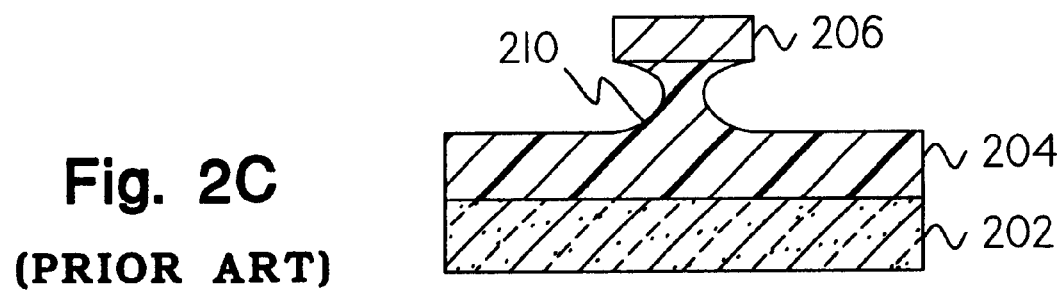
FIG. 2C shows the device of FIG. 2B after a third step in the conventional process.

In the event that some areas of the photoresist 108 are consumed during the etch (shown as removed portion 110 in FIG. 1B), a short oxygen/water plasma strip may be sufficient to remove chlorine from the underlying organic layer 104 with little or no impact on that layer. In contrast, and as mentioned above, if the conventional in situ plasma strip were used to totally remove the photoresist 108, the organic under layer would be severely eroded, as shown in FIG. 2C.

Figure 3:
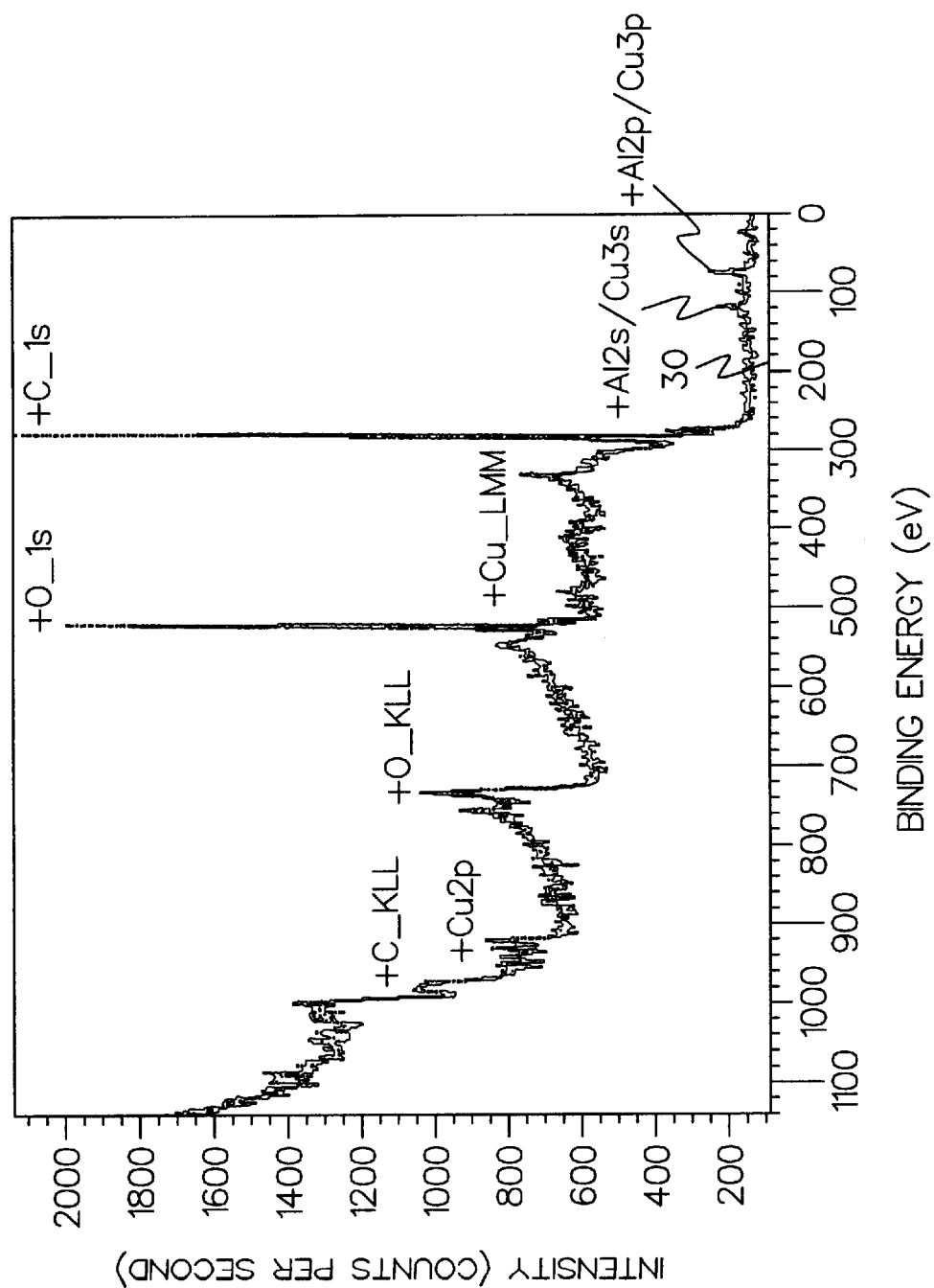
FIG. 3 is an X-ray Photo Spectroscopy (XPS) graph showing the absence of residual chlorine after completion of an exemplary embodiment of the process of the present invention.

Using the exemplary minimal plasma strip process of the present invention, corrosion protection is ensured. Referring to FIG. 3, X-ray Photo Spectroscopy (XPS) verifies, by absence of a peak indication at 30 (approximately 190 eV binding energy), that no residual chlorine exists after a plasma treatment of very short duration. With the chlorine removed, any number of wet solvent methods may be used to effectively remove the remaining photoresist 108A without undercutting the organic layer 104. It is preferable that the solvent be selected so as to be effective for removal of resist without modifying the underlying organic layer. In the exemplary embodiment, a polyimide under layer was used in combination with an AZ photoresist, and the solvents used were N-Methyl-2-Pyrrolidone (NMP) and a compond consisting of NMP, 74% by weight, 1,2-propanediol (propylene glycol), 24% by weight, and tetramethylammonium hydroxide (TMAH), 2% by weight (AZ Strip).

Figure 5:
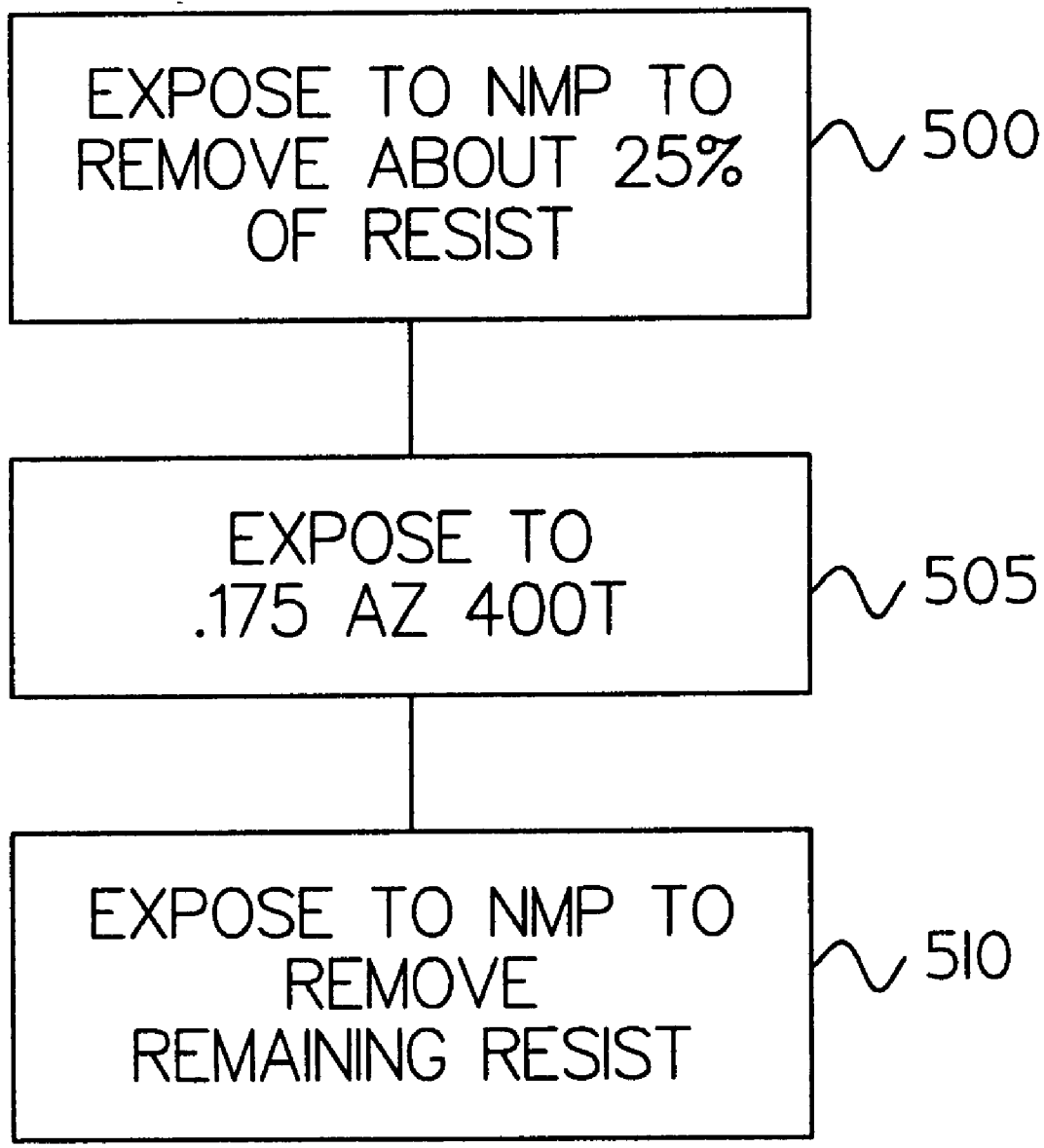
FIG. 5 is a flow chart illustrating the steps of another exemplary process of the present invention.

Referring to FIG. 5, another process according to the present invention is shown. At Step 500, after minimal plasma strip, the device 100 is exposed to NMP to remove about 25% of the photoresist 108. At Step 505, device 100 is exposed to a 0.175 AZ 400T AZ Strip to remove about 50% of the remaining photoresist 108. At Step 510, device 100 is again exposed to NMP to remove the remaining photoresist 108. This combination is aggressive enough to completely remove the photoresist 108, yet will not erode the polyimide so as to undercut the metal structures 106A.

Although the invention is illustrated and described above with reference to specific embodiments, the invention is not intended to be limited to the details shown. Rather, various modifications may be made in the details within the scope and range of equivalents of the claims and without departing from the invention. For example, the process of the present invention is not limited to diazonaphthoquinone-based resists; any resist system combined with an appropriate solvent strip may be used.

What is claimed:

1. A process for removing a resist material containing a chlorine residue from an organic substrate, the process comprising the steps of:

(a) removing the chlorine residue from the resist material by exposing the resist material to a plasma which removes only a portion of the resist material contaminated with the chlorine residue in order to minimize erosion of the organic substrate by the plasma, and (b) removing a remaining portion of the resist material by exposing the resist material to a solvent.

2. The process according to claim 1, wherein step (a) exposes the resist material to the plasma for a time period which results in a removal of less than about 50% of the resist material.

3. The process according to claim 1, wherein step (a) exposes the resist material to the plasma for a time period which results in a removal of about 25% to 50% of the resist material.

4. The process according to claim 1, wherein step (a) exposes the resist material to the plasma for a time period of about 20 to 100 seconds.

5. The process according to claim 4, wherein about 25% to 50% of the resist material is removed.

6. The process according to claim 1, wherein the plasma contains oxygen.

7. The process according to claim 1, wherein the resist material is a diazonaphthoquinone-based resist.

8. The process according to claim 1, wherein step (b) comprises the steps of:

(b1) exposing the resist material to a first organic water soluble solvent, (b2) exposing the resist material to a second organic water soluble solvent, and (b3) exposing the resist material to a third organic water soluble solvent.

9. The process according to claim 8, wherein the first organic water soluble solvent, the second organic water soluble solvent, and the third organic water soluble solvent are identical.

10. The process according to claim 8, wherein each of the first organic water soluble solvent, the second organic water soluble solvent, and the third organic water soluble solvent are an N-Methyl-2-Pyrrolidone (NMP)-based solvent or an organic resist strip.

11. The process according to claim 8, wherein:

the first organic water soluble solvent and the third organic water soluble solvent contain N-Methyl-2-Pyrrolidone (NMP), and the second organic water soluble solvent is a diazonaphthoquinone-based solvent.

12. A method of forming a passive RF device over a substrate, the method comprising the steps of:

(a) forming an organic layer over the substrate, (b) forming a metal layer over the organic layer, (c) disposing a photoresist over the metal layer, (d) exposing a least a portion of the photoresist to an illumination source to define a pattern of the RF device on the metal layer, (e) removing an unexposed portion of the photoresist from the metal layer to expose at least a portion of the metal layer, (f) etching the portion of the metal layer using an etchant containing chlorine, the etching exposing at least a portion of the organic layer, (g) removing chlorine residue from the photoresist and the exposed portion of the organic layer by exposure to a plasma, to remove only a portion of the photoresist contaminated with the chlorine residue in order to minimize erosion of the organic layer by the plasma, and (h) removing a remaining portion of the photoresist material with a solvent.

13. The process according to claim 12, wherein step (g) exposes the photoresist to the plasma for a time period which results in removal of about 25% of the photoresist.

14. The process according to claim 12, wherein the plasma contains oxygen.

15. The process according to claim 12, wherein step (h) comprises the steps of:

(h1) exposing the photoresist to a first solvent containing N-Methyl-2-Pyrrolidone (NMP), (h2) exposing the photoresist to a second solvent containing NMP, propylene glycol, and tetramethylammonium hydroxide, and (h3) exposing the photoresist to a third solvent containing NMP.

16. A process for forming patterns over a substrate comprising the steps of:

(a) forming an organic layer over the substrate, (b) forming a metal layer over the organic layer, (c) disposing a photoresist over the metal layer, (d) exposing a least a portion of the photoresist to an illumination source to define a pattern on the metal layer, (e) removing a portion of the photoresist from the metal layer to expose at least a portion of the metal layer, (f) etching the portion of the metal layer using an etchant containing chlorine, the etching exposing at least a portion of the organic layer, (g) removing chlorine residue from the photoresist and the exposed portion of the organic layer by exposure to a plasma, to remove only a portion of the photoresist contaminated with the chlorine residue in order to minimize erosion of the organic layer by the plasma, and (h) removing the remaining portion of the photoresist with a solvent.

17. The process according to claim 16, wherein the organic layer has a low dielectric constant.

18. The process according to claim 17, wherein the organic layer is a polyimide.

19. The process according to claim 16, wherein the substrate is a silicon substrate.

20. The process according to claim 16, wherein the organic layer is unaffected by the process of step (f).

21. The process according to claim 16, wherein step (f) is a reactive ion etch (RIE).

22. The process according to claim 16, wherein the plasma contains oxygen and step (g) exposes the photoresist to the plasma for a time period which results in removal of about 25% of the photoresist.

23. The process according to claim 16, wherein the plasma contains oxygen and water and step (g) exposes the photoresist to the plasma for a time period which results in a removal of about 25% of the photoresist.

24. The process according to claim 16, wherein step (h) is a wet etch process.

25. The process according to claim 24, wherein step (h) comprises the steps of:

(h1) exposing the resist material to a first solvent containing N-Methyl-2-Pyrrolidone (NMP), (h2) exposing the resist material to a second solvent containing NMP, propylene glycol, and tetramethylammonium hydroxide, and (h3) exposing the resist material to a third solvent containing NMP.

* * * * *